United States Patent
Pan

(10) Patent No.: US 12,477,827 B2
(45) Date of Patent: Nov. 18, 2025

(54) DRIVING SUBSTRATE WITH A THIN FILM TRANSISTOR HAVING OVERLAPPED METAL LAYERS AND SEMICONDUCTOR LAYER

(71) Applicant: Innolux Corporation, Miao-Li County (TW)

(72) Inventor: May Pan, Tainan (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 18/417,329

(22) Filed: Jan. 19, 2024

(65) Prior Publication Data

US 2024/0153960 A1 May 9, 2024

Related U.S. Application Data

(63) Continuation of application No. 17/984,061, filed on Nov. 9, 2022, now Pat. No. 11,916,080, which is a continuation of application No. 17/217,877, filed on Mar. 30, 2021, now Pat. No. 11,527,555.

(51) Int. Cl.
| | |
|---|---|
| *H10D 86/60* | (2025.01) |
| *G02F 1/1362* | (2006.01) |
| *G02F 1/1368* | (2006.01) |
| *H10D 30/67* | (2025.01) |
| *H10D 86/40* | (2025.01) |

(52) U.S. Cl.
CPC ....... *H10D 86/60* (2025.01); *G02F 1/136281* (2021.01); *G02F 1/136286* (2013.01); *G02F 1/1368* (2013.01); *G02F 1/13685* (2021.01); *H10D 30/6732* (2025.01); *H10D 30/6746* (2025.01); *H10D 30/6757* (2025.01); *H10D 86/421* (2025.01); *G02F 2202/103* (2013.01); *G02F 2202/28* (2013.01)

(58) Field of Classification Search
CPC .......................... G02F 1/13454; G02F 1/1368
See application file for complete search history.

(56) References Cited

U.S. PATENT DOCUMENTS

| | | | | |
|---|---|---|---|---|
| 5,790,222 | A * | 8/1998 | Kim | G02F 1/136286 349/147 |
| 6,207,481 | B1 * | 3/2001 | Yi | H10D 30/0314 257/E29.147 |
| 2001/0017372 | A1 * | 8/2001 | Koyama | H01L 27/1248 438/30 |
| 2008/0029767 | A1 * | 2/2008 | Nagata | H10D 30/6739 257/E29.147 |

* cited by examiner

*Primary Examiner* — Lauren Nguyen
(74) *Attorney, Agent, or Firm* — Patterson + Sheridan, LLP

(57) ABSTRACT

A driving substrate is provided. The driving substrate includes a substrate and a thin film transistor disposed on the substrate. The thin film transistor includes a first metal layer, a second metal layer, and a semiconductor. The first metal layer has a first portion, a second portion, and a first bridge. The second metal layer has a third portion, a fourth portion, and a second bridge. The first metal layer is overlapped with the second metal layer and the semiconductor. In a top view, the first portion and the second portion are separated by a first gap and are connected by the first bridge, the third portion and the fourth portion are separated by the first gap and are connected by the second bridge.

9 Claims, 13 Drawing Sheets

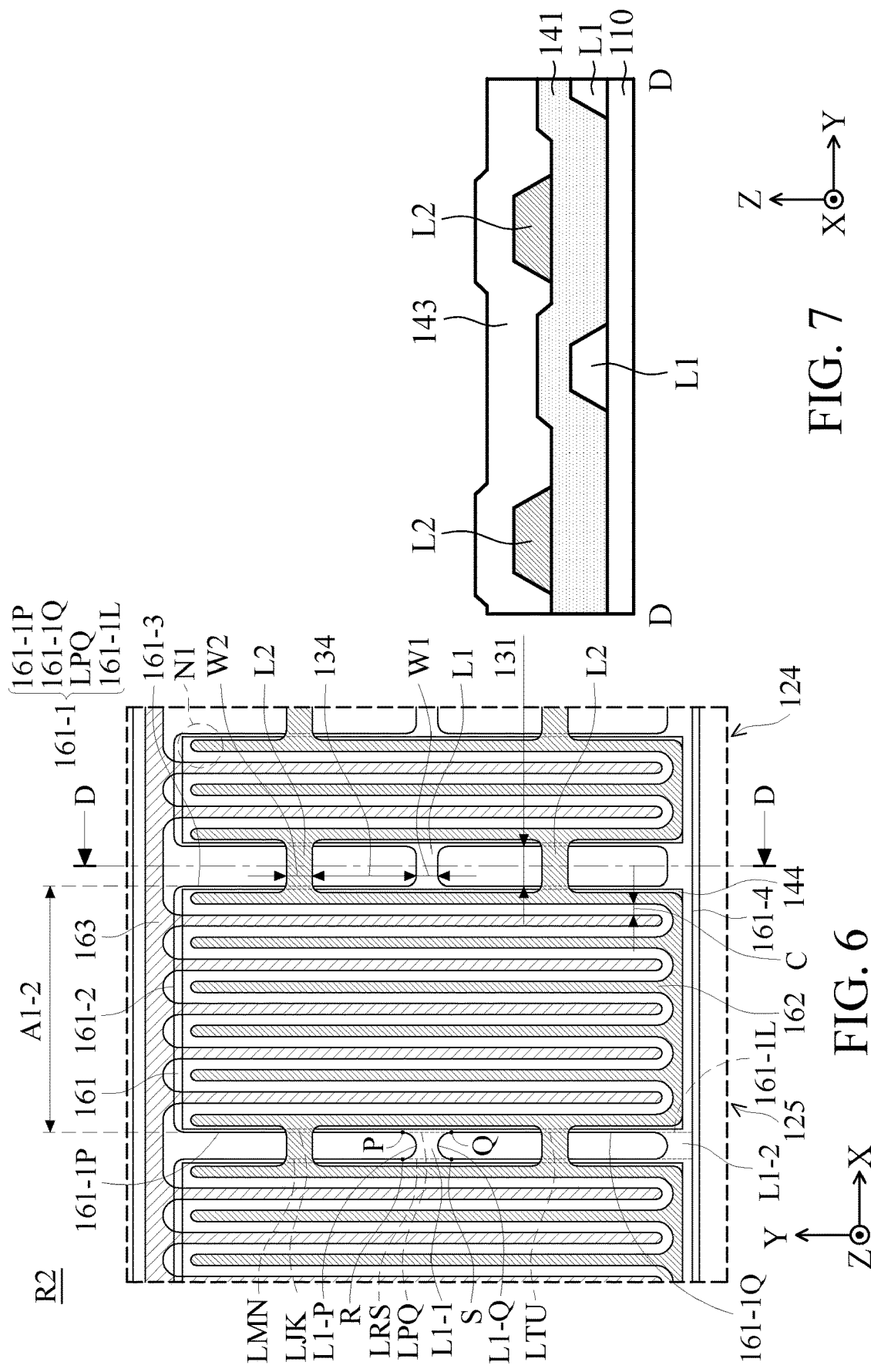

DRIVING SUBSTRATE WITH A THIN FILM TRANSISTOR HAVING OVERLAPPED METAL LAYERS AND SEMICONDUCTOR LAYER

CROSS REFERENCE TO RELATED APPLICATIONS

This application is a Continuation of pending U.S. patent application Ser. No. 17/984,061, filed Nov. 9, 2022 and entitled "DRIVING SUBSTRATE WITH A THIN FILM TRANSISTOR DIVIDED INTO MULTIPLE ACTIVE BLOCKS THAT ARE CONNECTED TO EACH OTHER BY A BRIDGE," which is a Continuation of granted U.S. Pat. No. 11,527,555, filed Mar. 30, 2021 and entitled "DRIVING SUBSTRATE AND ELECTRONIC DEVICE WITH A THIN FILM TRANSISTOR THAT IS DIVIDED INTO MULTIPLE ACTIVE BLOCKS," the entirety of which are incorporated by reference herein.

BACKGROUND

Field of the Disclosure

The present disclosure relates to a driving substrate and an electronic device, and in particular to a driving substrate and an electronic device including a thin film transistor that is divided into multiple active blocks.

Description of the Related Art

Driving substrates are commonly used in various electronic devices (such as display devices). In present electronic devices, the driving substrates are bonded to other components via adhesive materials (such as photocuring adhesive material). However, the adhesion of the adhesive material still needs to be improved, for example, to reduce the peeling risk of the driving substrates. Therefore, how to solve the above problem has become an important issue.

BRIEF SUMMARY

Some embodiments of the disclosure provide a driving substrate, including: a substrate and a thin film transistor disposed on the substrate. The thin film transistor includes a first metal layer, a second metal layer, and a semiconductor. The first metal layer has a first portion, a second portion, and a first bridge. The second metal layer has a third portion, a fourth portion, and a second bridge. The first metal layer is overlapped with the second metal layer and the semiconductor. In a top view, the first portion and the second portion are separated by a first gap and are connected by the first bridge, the third portion and the fourth portion are separated by the first gap and are connected by the second bridge.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIG. 6 is an enlarged view illustrating the driving substrate in the region R2 shown in FIG. 5 in accordance with some embodiments of the present disclosure.

FIG. 7 is a cross-sectional view illustrating the driving substrate along line D-D shown in FIG. 6.

DETAILED DESCRIPTION

Figure 1:
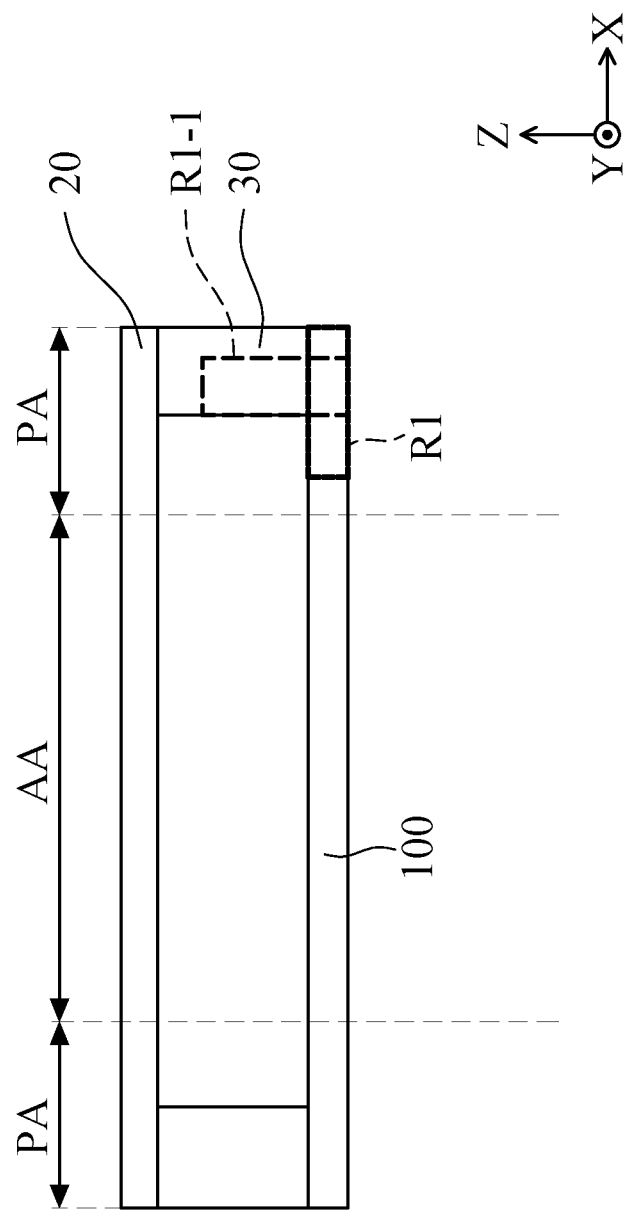
FIG. 1 is a cross-sectional view illustrating an electronic device in accordance with some embodiments of the present disclosure.

The present disclosure may be understood referring to the following description and the appended drawings. In addition, the number and size of each component in the drawings merely serve as an example, but are not intended to limit the scope of the present disclosure. Furthermore, similar and/or corresponding numerals may be used in different embodiments for describing some embodiments simply and clearly, but not represent any relationship between different embodiment and/or structures discussed below.

Certain terms may be used throughout the present disclosure and the appended claims to refer to particular elements. Those skilled in the art will understand that electronic device manufacturers may refer to the same components by different names. The present specification is not intended to distinguish between components that have the same function but different names. In the following specification and claims, the words "including", "comprising", "having" and the like are open words, so they should be interpreted as meaning "including but not limited to . . . ". Therefore, when terms "including", "comprising", and/or "having" are used in the description of the disclosure, the presence of corresponding features, regions, steps, operations and/or components is specified without excluding the presence of one or more other features, regions, steps, operations and/or components.

In addition, in this specification, relative expressions may be used. For example, "lower", "bottom", "higher" or "top" are used to describe the position of one element relative to another. It should be noted that if a device is flipped upside down, an element that is "lower" will become an element that is "higher".

When a corresponding component (such as a film layer or region) is referred to as "on another component", it may be directly on another component, or there may be other components in between. On the other hand, when a component is referred "directly on another component", there is no component between the former two. In addition, when a component is referred "on another component", the two components have an up-down relationship in the top view, and this component can be above or below the other component, and this up-down relationship depends on the orientation of the device.

The terms "about" or "substantially" are generally interpreted as within 20% of a given value or range, or as interpreted as within 10%, 5%, 3%, 2%, 1%, or 0.5% of a given value or range.

It should be understood that, although the terms "first", "second" etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims can be interpreted as any element that meets the description in the specification.

In the present disclosure, the thickness, length, and width can be measured by using an optical microscope, and the thickness can be measured by the cross-sectional image in the electron microscope, but it is not limited thereto. In addition, a certain error may be present in a comparison with any two values or directions. If the first value is equal to the second value, it implies that an error of about 10% between the first value and the second value may be present. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

It should be noted that the technical solutions provided by different embodiments below may be interchangeable, combined or mixed to form another embodiment without departing from the spirit of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. It should be noted that the description "a first feature is/may be disposed on a second feature" herein may include embodiments in which the first feature and the second feature are formed in direct contact, and may also include embodiments in which additional features may be formed between the first feature and the second feature, such that the first feature and the second feature may not be in direct contact.

FIG. 1 is a cross-sectional view illustrating an electronic device 10 in accordance with some embodiments of the present disclosure. It should be noted that the electronic device 10 may include, for example, a display device, an antenna device, a sensing device, a touch display, a curved display, or a free shape display, the electronic device may also be a bendable or flexible electronic device, but is not limited thereto. The electronic device may include, for example, a light-emitting diode, liquid-crystal, fluorescence, phosphor, quantum dot (QD), other suitable display media, or a combination thereof, but is not limited thereto. The light-emitting diode may include, for example, an organic light-emitting diode (OLED), an inorganic light-emitting diode, a mini LED, a micro LED or quantum dot (QD) light-emitting diode (which may be referred to as QLED, QDLED), other suitable materials, or a combination thereof, and these materials can be arranged and combined arbitrarily, but the present disclosure is not limited thereto. The antenna device may be a liquid-crystal antenna, but it is not limited thereto. It should be noted that the electronic device may be any combination thereof, but it is not limited thereto. In addition, the shape of the electronic device may be rectangle, circle, polygon, a curve-edged shape, or any other suitable shape. The electronic device may include a peripheral system, such as a driving system, a control system, a light source system, a shelf system, etc. to support the display device or the antenna device.

As shown in FIG. 1, the electronic device 10 may include a driving substrate 100, an opposite substrate 20, and an adhesive material 30. The opposite substrate 20 is disposed opposite to the driving substrate 100, and at least a portion of the adhesive material 30 is disposed between the driving substrate 100 and the opposite substrate 20. In the present embodiment, the electronic device 10 includes a display region AA and a peripheral region PA located adjacent to the display region AA. In some embodiments, the peripheral region PA may completely surround the display region AA in a top view. In some embodiments, the peripheral region PA may partially surround the display region AA in the top view, that is, the display region AA may be located on at least one of edge of the electronic device 10 or the display region AA may be located on at least one of borders of the electronic device 10. For example, the peripheral region PA may be a "Π" shape or a "C" shape in a top view. However, the present disclosure is not limited thereto. The adhesive material 30 is disposed at the peripheral region PA to bond the driving substrate 100 and the opposite substrate 20. In the present embodiment, a region R1 is defined in the peripheral region PA and includes a portion of the driving substrate 100. In addition a region R1-1 is defined to include a portion of the driving substrate 100 and a portion of the adhesive material 30.

Figure 2:
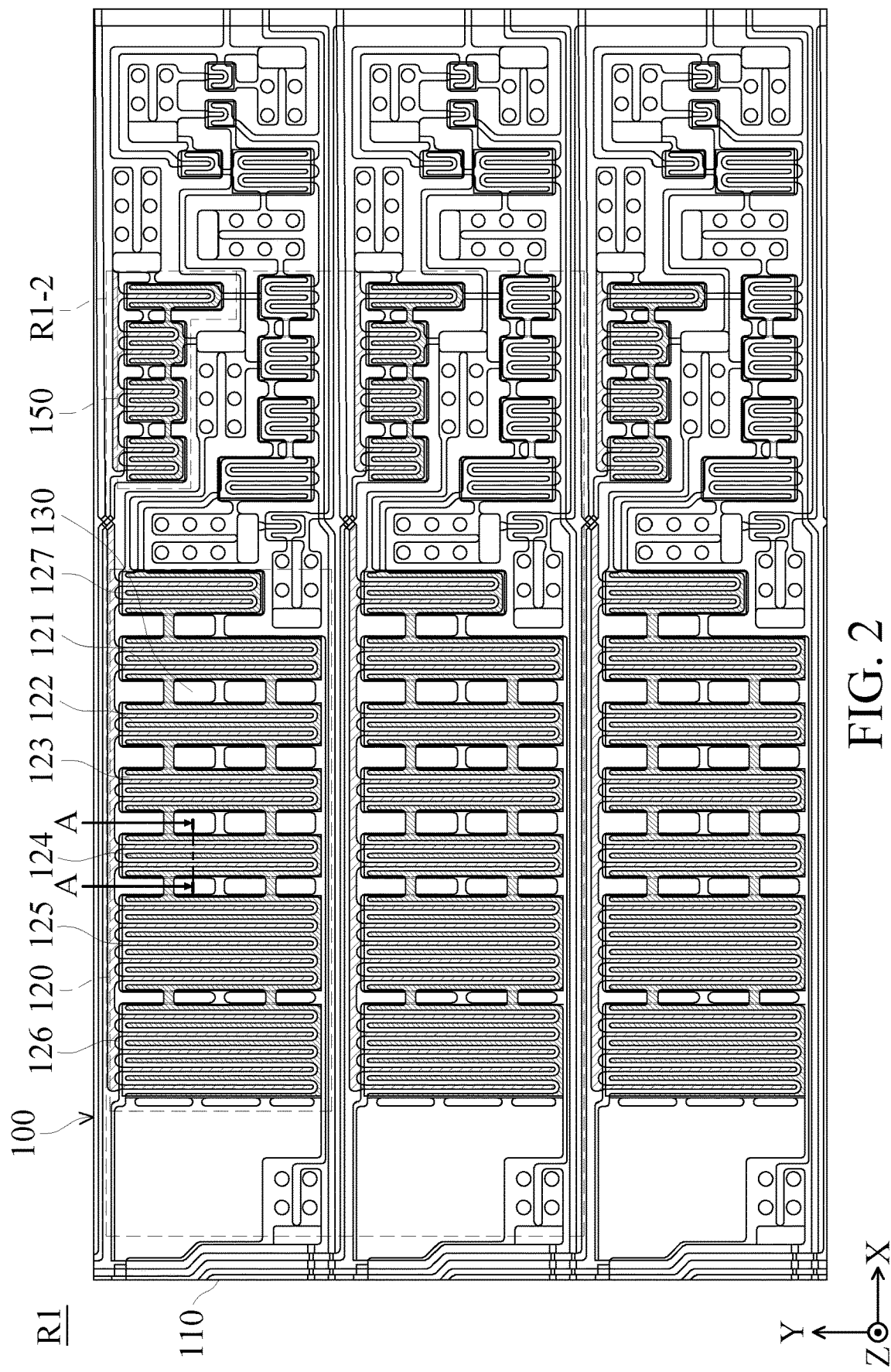
FIG. 2 is a top view illustrating a driving substrate in the region R1 shown in FIG. 1 in accordance with some embodiments of the present disclosure.

FIG. 2 is a top view illustrating the driving substrate 100 in the region R1 shown in FIG. 1 in accordance with some embodiments of the present disclosure. As shown in FIG. 2, the driving substrate 100 may include a substrate 110 and at least one thin film transistor, e.g. a thin film transistor 120 and a thin film transistor 150, disposed on the substrate 110.

The thin film transistor 120 is divided into at least two active blocks, for example, the active blocks 121, 122, 123, 124, 125, 126 and 127. It is noted that in the present disclosure, the term "divided into" may be referred to divide an element equally in size, or divide the element unequally in size. For example, a width of the active block 123 is different from a width of the active block 125. It is noted that the thin film transistor 120 may be divided into multiple active blocks, and the number of the active blocks is not limited thereto. In the present embodiment, a gap 130 is formed between two adjacent ones of the at least two active blocks, for example, the active block 121 and the active block 122, that is, the active block 121 and the active block 122 are separated from each other by the gap 130 in the direction X. It is noted that the term "gap" in the present disclosure may be referred to as a width, and the unit of the width may be centimeter, millimeter, nanometer, quark, etc. However, the present disclosure is not limited thereto. The details regarding the dimension of the active blocks and the gaps therebetween will be discussed below.

According to some embodiments, the material of the substrate 110 may include glass, sapphire, ceramics, plastics, or other suitable materials. The plastic material may be, for example, polyimine (PI), polyethylene terephthalate (PET), polycarbonate (PC), polyether oxime (PES), polybutylene terephthalate (PBT), polynaphthalene ethylene glycolate (PEN), polyarylate (PAR), other suitable materials, or a combination thereof, but the present disclosure is not limited thereto. It should be understood that the driving substrate 100 may include conductive components configured to transmit signals. However, the substrate 110 may be a flexible substrate or a non-flexible substrate, but the present disclosure is not limited thereto.

Figure 3:
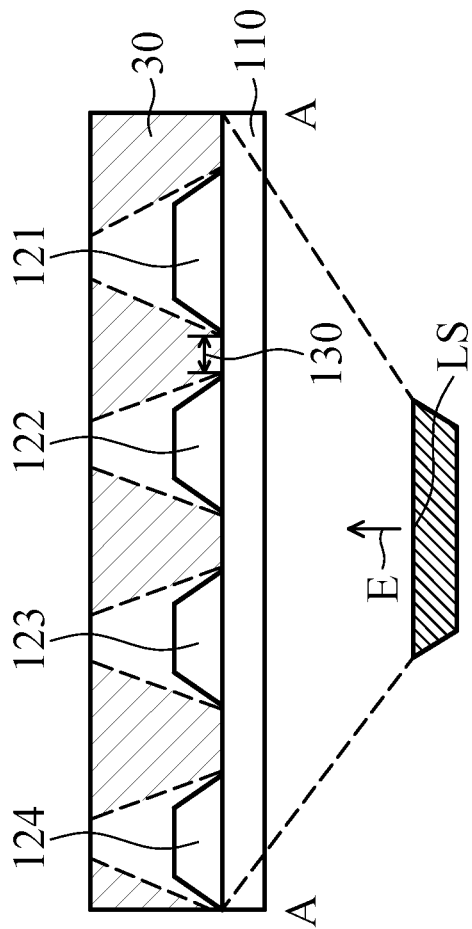
FIG. 3 is an enlarged view illustrating the region R1-1 shown in FIG. 1 in accordance with some embodiments of the present disclosure.

FIG. 3 is an enlarged view illustrating the region R1-1 shown in FIG. 1 in accordance with some embodiments of the present disclosure. As shown in FIG. 3, the adhesive material 30 is disposed on the driving substrate 100 for bonding to the opposite substrate 20 (as shown in FIG. 1). In some embodiments, the adhesive material 30 is a photo-curing adhesive material, but it is not limited thereto. In the present embodiments, a light source LS is provided, and light is emitted in a direction E toward the driving substrate 100. In some embodiments, the light is UV light, and the adhesive material 30 is an UV curing adhesive material. In the present embodiments, the light may pass through a space having the gaps between the active blocks (such as the gap 130 between the active block 121 and the active block 122, shown as the marked region in FIG. 3) and illuminate the adhesive material 30. As such, the adhesive material 30 may be cured and therefore the driving substrate 100 may be bonded to the opposite substrate 20.

In some embodiments, at least a portion of the adhesive material 30 is disposed between the thin film transistor 120 and the opposite substrate 20. The active blocks 121, 122, 123, and 124 of the thin film transistor 120 are shown as trapezoids, and therefore the light passes through the spaces having gaps (such as the gap 130) between the active blocks and travel in the region between two adjacent dotted lines as shown in FIG. 3. In the present embodiment, since the active blocks 121, 122, 123, and 124 are shown as trapezoids, the cured adhesive material 30 (which is illuminated by the light) may at least partially overlap with the active blocks 121, 122, 123, and 124 in a top view. However, the shape of the active blocks 121, 122, 123, and 124 in the present embodiment is merely example, and those skilled in the art would adjust the shape of the active blocks 121, 122, 123, and 124 as required. Since the thin film transistor 120 is divided into multiple active blocks, the light may pass through the spaces having gaps between the active blocks, and the area of the cured adhesive material 30 may increase, enhancing the adhesion of the adhesive material 30. As such, the peeling possibility of the driving substrate 100 may be reduced.

Figure 4:
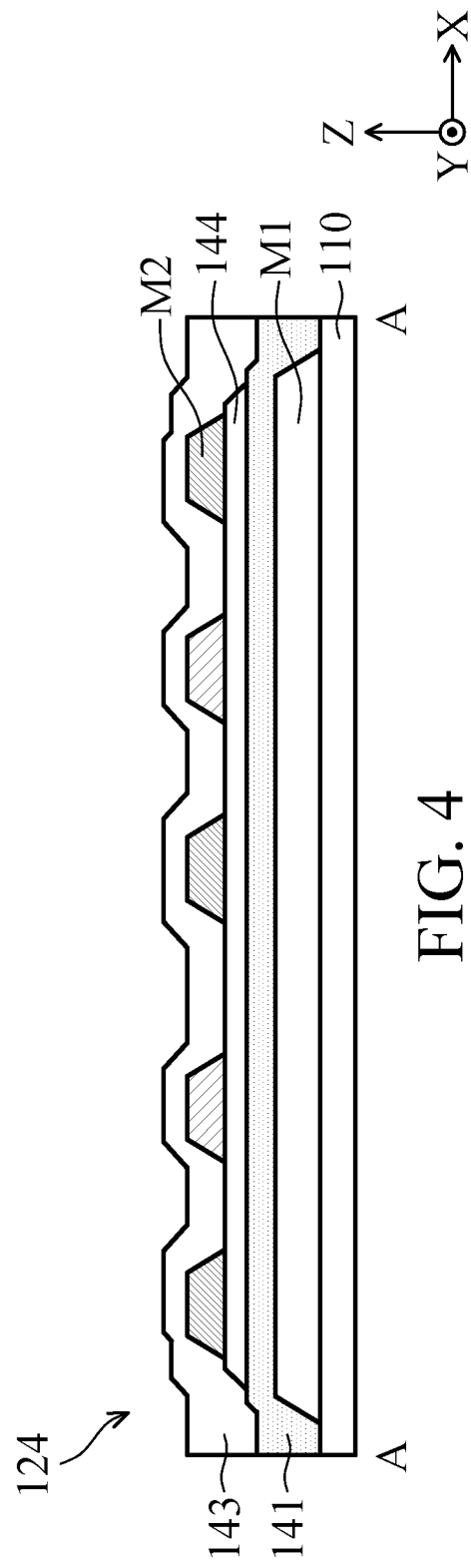
FIG. 4 is a cross-sectional view illustrating an active block along the line A-A shown in FIG. 2 in accordance with some embodiments of the present disclosure.

FIG. 4 is a cross-sectional view illustrating the active block 124 along the line A-A shown in FIG. 2 in accordance with some embodiments of the present disclosure. As shown in FIG. 4, the active block 124 is disposed on the substrate 110, and may include a first metal layer M1 and a second metal layer M2. A first insulating layer 141 is disposed on the first metal layer M1 and located between the first metal layer M1 and the second metal layer M2. In some embodiments, the semiconductor 144 is disposed on the first metal layer M1 and disposed between the first metal layer M1 and the second metal layer M2. In some embodiments, the first insulating layer 141 may be disposed between the semiconductor 144 and the first metal layer M1. A second insulating layer 143 is disposed on the second metal layer M2. It is noted that since the first metal layer M1 and the second metal layer M2 are opaque, the light may not pass through the active block 121 but pass through the space having the gap between the active blocks.

Figure 5:
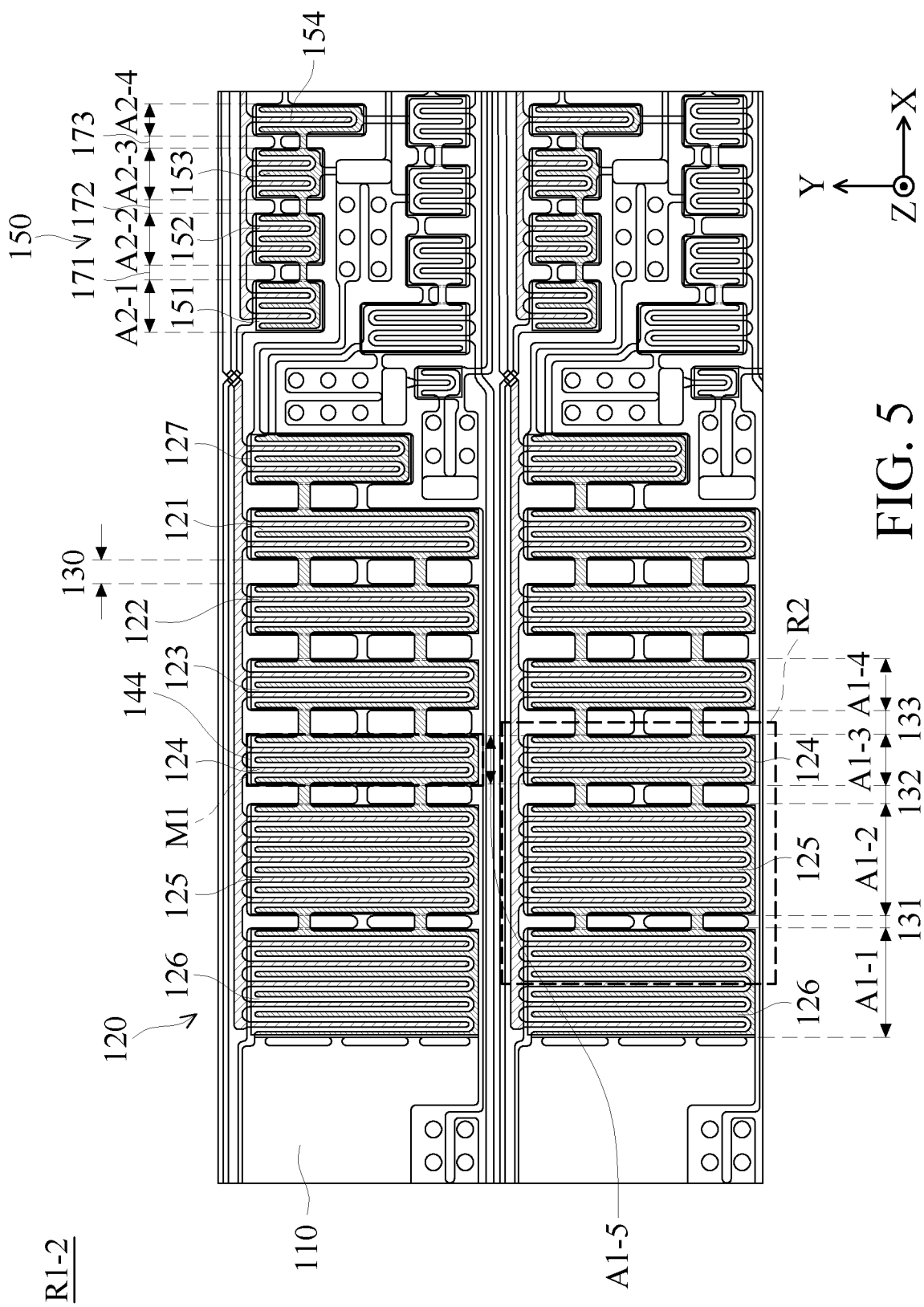
FIG. 5 is an enlarged view illustrating the region R1-2 shown in FIG. 2 in accordance with some embodiments of the present disclosure.

FIG. 5 is an enlarged view illustrating the region R1-2 shown in FIG. 2 in accordance with some embodiments of the present disclosure. As shown in FIG. 5, the thin film transistor 120 is divided into at least two active blocks, for example, the active blocks 121, 122, 123, 124, 125, 126 and 127. In the present embodiment, a gap 131 is formed between two adjacent active block 125 and active block 126, that is, the active block 125 and the active block 126 are separated from each other by the gap 131. Similarly, a gap 132 may be form between the active block 124 and the active block 125, and a gap 133 may be formed between the active block 123 and the active block 124.

In some embodiments, a ratio of the gap to an average width of the two adjacent active blocks in the first direction (such as the direction X) is greater than or equal to 0.1 and less than 0.5 (for example, 0.1≤the gap 131/[(the width A1-1+the width A1-2)/2]<0.5). For example, the width A1-1 of the active block 126 and the width A1-2 of the active block 125 are about 72.15 μm, and the gap 131 between the active blocks 125 and 126 is about 11.56 μm. Accordingly, the ratio of the gap 131 to an average width of the two adjacent active blocks 125 and 126 in the first direction is about 0.16. In some embodiments, the width A1-3 of the active block 124 and the width A1-4 of the active block 123 are about 33.3 μm, the gap 132 is about 11.56 μm, and the gap 133 is about 15.72 μm. Accordingly, the ratio of the gap 132 to an average width of the two adjacent active blocks 124 and 125 in the first direction is about 0.22, and the ratio of the gap 133 to an average width of the two adjacent active blocks 123 and 124 in the first direction is about 0.47. If the ratio of the gap to an average width of the two adjacent active blocks is too small, the risk of short circuit between the adjacent active block would increase. Otherwise, if the ratio of the gap to an average width of the two adjacent active blocks is too high, the size of the peripheral region PA of the electronic device 10 may increase to an unacceptable degree.

In addition, the thin film transistor 150 is disposed on the substrate 110 and divided into at least two active blocks, for example, the active blocks 151, 152, 153, and 154. In the present embodiment, a gap 171 is formed between two adjacent active blocks 151 and 152, that is, the active blocks 151 and 152 are separated from each other by the gap 171.

Similarly, a gap 172 may be form between the active blocks 152 and 153, and a gap 173 may be formed between the active block 153 and the active block 154.

In some embodiments, a ratio of the gap to an average width of the two adjacent active blocks in the first direction (such as the direction X) is greater than or equal to 0.1 and less than 0.5 (for example, 0.1≤the gap 171/[(the width A2-1+the width A2-2)/2]<0.5). For example, the width A2-1 of the active block 151, the width A2-2 of the active block 152, and the width A2-3 of the active block 153 are about 33.3 μm, and the gap 171 and the gap 172 are about 8.79 μm. Accordingly, the ratio of the gap 171 to an average width of the two adjacent active blocks 151 and 152 and the ratio of the gap 172 to an average width of the two adjacent active blocks 152 and 153 in the first direction is about 0.26. In some embodiments, the width A2-4 of the active block 154 is about 21.27 μm, the gap 173 is about 7.4 μm. Accordingly, the ratio of the gap 173 to an average width of the two adjacent active blocks 153 and 154 in the first direction is about 0.27.

In some embodiments, one of the at least two active blocks may be closer to the display region AA than another one of the at least two active blocks, the width of the one of the at least two active blocks may be greater than the width of the another one of the at least two active blocks. For example, the active block 126 may be closer to the display region AA than the active block 124, and the width A1-1 of the active block 126 may be greater than the the width A1-3 of the active block 124. According to some embodiments, the gap 132 may be greater than the gap 131. In some embodiments, the width A1-2 of the active block 125 may be equal to the width A1-1 of the active block 126.

According to some embodiments, as shown in FIG. 3, the adhesive material 30 may be disposed between two adjacent ones of the at least two active blocks, such as the active block 124 and the active block 123.

FIG. 6 is an enlarged view illustrating the driving substrate 100 in the region R2 shown in FIG. 5 in accordance with some embodiments of the present disclosure. As shown in FIG. 6, the thin film transistor 120 includes a gate electrode, a semiconductor, a source electrode, and a drain electrode. Each of the active blocks 121, 122, 123, 124, 125, and 126 may include a portion of the gate electrode, a portion of the semiconductor, a portion of the source electrode, and a portion of the drain electrode. For example, as shown in FIG. 4, the first metal layer M1 of the active block 124 may be the portion of the gate electrode, and the second metal layer M2 of the active block 124 may be the portion of the source electrode of the active block 124 and/or the portion of the drain electrode of the active block 124, and the semiconductor 144 of the active block 124 may be portion of the semiconductor of the thin film transistor 120.

In some embodiments, as shown in FIG. 5, a width A1-5 of the semiconductor 144 of the active block 124 may be less than a width A1-3 of the first metal layer M1 of the active block 124. To be noted that, in the top view, the width of the active block as mentioned above may be the width of the portion of the gate electrode of the thin film transistor. For example, as shown in FIG. 5, the width A1-3 of the active block 124 may be a minimum width of the portion of the gate electrode. To be more specific, the above widths and the above gaps are measured in, for example, the direction X of the top view, but the present disclosure is not limited thereto.

The portions of the gate electrode, the portions of the source electrode or the portions of the drain electrode in different active blocks 121, 122, 123, 124, 125, and 126 are electrically connected with each other. According to some embodiments, the semiconductor in the thin film transistor 120 may be made of amorphous silicon, but it is not limited thereto.

According to some embodiments, as shown in FIG. 6, the active block 125 may include a portion 161 of the gate electrode of the thin film transistor 120, a portion 144 of the semiconductor of the thin film transistor 120, a portion 162 of the source electrode of the thin film transistor 120, and a portion 163 of the drain electrode of the thin film transistor 120. In some embodiment, in the top view, the portion 162 of the source electrode and/or the portion 163 of the drain electrode have/has a curved edge. For example, as shown in a region N1, the portion 162 of the source electrode has a curved edge.

In some embodiments, the portions of the gate electrode in different active blocks 121, 122, 123, 124, 125, and 126 are electrically connected with each other by at least one first bridge L1. In some embodiments, a number of the first bridges L1 may be greater than or equal to two. For example, as shown in FIG. 6, the number of the first bridges L1 is equal to two, e.g. the first bridge L1-1 and the first bridge L1-2. In some embodiments, the portions of the source electrode or the portions of the drain electrode in different active blocks 121, 122, 123, 124, 125, and 126 are electrically connected with each other by at least one second bridge L2. In some embodiments, a number of the second bridges L2 may be greater than or equal to two.

It is noted that the first bridge L1 may be defined between the places where the portion of the gate electrode change direction. For example, as shown in FIG. 6, the portion 161 of the gate electrode has a side 161-1, a side 161-2, a side 161-3, and a side 161-4. It should be noted that the active block 125 may be a region surrounded by the side 161-1, the side 161-2, the side 161-3, and the side 161-4. The side 161-1 may be divided into a sub-side 161-1P, a sub-side LPQ, a sub-side 161-1Q, and a sub-side 161-1L, but is not limited thereto. In some embodiments, the sub-side 161-1P, the sub-side 161-1Q, and the sub-side 161-1L may extend in a second direction (such as the direction Y). The sub-side 161-1P may change the extending direction at a point P, and the sub-side 161-1Q may change the extending direction at a point Q, the connecting line between the point P and the point Q may be the sub-side LPQ. In some embodiments, the sub-side LPQ may be a side of the first bridge L1. A sub-side LRS may be obtained in the similar manner. To be more specific, the sub-side LRS may be the connecting line between the point R and the point S, and the point R and the point S may be defined similarly to the point P and the point Q. The detailed discussion will not be repeated below.

The side 161-3 of the portion 161 of the gate electrode may also be divided into four sub-sides (referring to the side 161-1), it will not be discussed in detail for the sake of simplicity. The side 161-2 and the side 161-4 may be disposed correspondingly and may extend substantially along the first direction (such as the direction X). To be noted that, in the top view, the point P may be an end point of the sub-side 161-1P of the portion 161 of the gate electrode and a start point of a side L1-P of the first bridge L1-1. Similarly, in the top view, the point Q may be an end point of the sub-side 161-1Q of the portion 161 of the gate electrode and a start point of a side L1-Q of the first bridge L1. In other words, the first bridge L1 may be a region surrounded by the sub-side LPQ, the side L1-Q, the sub-side LRS, and the side L1-P. In some embodiment, a length of the first bridge L1 may be substantially equal to the gap 131.

It should be noted that the locations of the source electrode and the drain electrode are interchangeable. In FIG. 6, a line LMN and a line LJK are two sides of the second bridge L2, and the line LJK is a borderline between the portion 162 of the source electrode and the second bridge L2. According to some embodiments, the line LJK may be a portion of the side 161-1 of the portion 161 of the gate electrode. That is, the line LJK may be the portion of the side 161-1 that overlaps the portion 162 of the source electrode in the top view. For example, as shown in FIG. 6, the portion of the side 161-1 that overlaps the portion 162 of the source electrode in the top view may be the line LJK and the line LTU.

In the present embodiment, a minimum distance (for example, a distance C) between the portion 162 of the source electrode and the portion 163 of the drain electrode is less than the gap 131 in the first direction (for example, the direction X). To be more specific, the distance C is less than the gap 131, and the gap 131 is further less than the width A1-2 of the active block 125, as set forth above. With the configuration that the gap 131 is greater than the distance C between the portion 162 of the source electrode and the portion 163 of the drain electrode, the possibility of short circuit between the adjacent active blocks may be reduced.

In the present embodiment, in the second direction (such as the direction Y) that is perpendicular to the first direction, one of the at least one first bridge L1 is separated from an adjacent one of the at least one second bridge L2 by a gap 134 in the second direction. The first bridge L1 has a first width W1, the adjacent one of the at least one second bridge L2 has a second width W2, and a ratio of the gap (for example, the gap 134) to a sum of the gap (such as the gap 134) and an average of the first width W1 and the second width W2 is greater than or equal to 70% and less than or equal to 90% (70%≤the gap 134/[(the gap 134+(the first width W1+the second width W2)/2]≤90%).

In some embodiments, an average of the first width W1 and the second width W2 is about 5.55 μm, and the gap 134 is about 43 μm. Accordingly, the ratio of the gap 134 to a sum of the gap 134 and an average of the first width W1 and the second width W2 is about 88.6%. In some other embodiments, an average of the first width W1 and the second width W2 is about 6.97 μm, and the gap 134 is about 33.44 μm. Accordingly, the ratio of the gap 134 to a sum of the gap 134 and an average of the first width W1 and the second width W2 is about 82.8%. According to some embodiments, in the top view, the first bridges L1 is not overlapped with the second bridges L2.

FIG. 7 is a cross-sectional view illustrating the driving substrate along line D-D shown in FIG. 6. In some embodiments, the first bridge L1 and the second bridges L2 are interlaced. In this way, the capacitance generated between the first bridges L1 and the second bridges L2 may be reduced, lowering the possibility of failure. In some embodiments, the first bridge L1 and the second bridges L2 are in different layers (i.e. on different horizontal planes). In other words, the second bridges L2 and the first bridge L1 may be made in different process.

Figure 8:
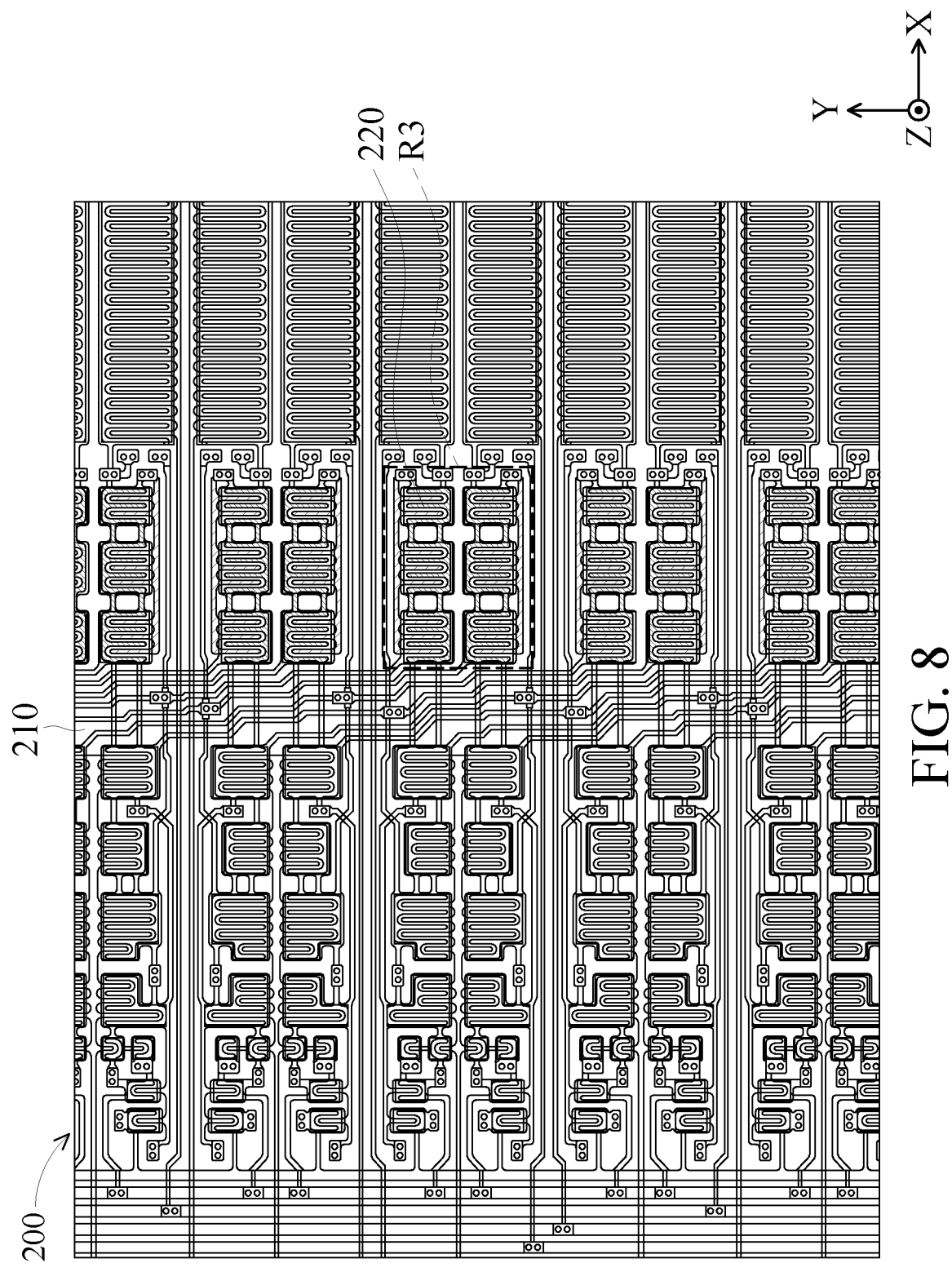
FIG. 8 is a top view illustrating the driving substrate in accordance with some embodiments of the present disclosure.

FIG. 8 is a top view illustrating the driving substrate 200 in accordance with some embodiments of the present disclosure. It should be noted that the driving substrate 200 in the present embodiment may include similar components as the driving substrate 100 shown in FIG. 2. For the sake of simplicity and clarity, these similar components will be denoted by similar numerals, and will not be discussed in detail. For example, the driving substrate 200 includes a substrate 210 and at least one thin film transistor, such as a thin film transistor 220, disposed on the substrate 210. The thin film transistor 220 is divided into at least two active blocks, and the details regarding the dimension of the active blocks and the gaps therebetween will be discussed below.

Figure 9:
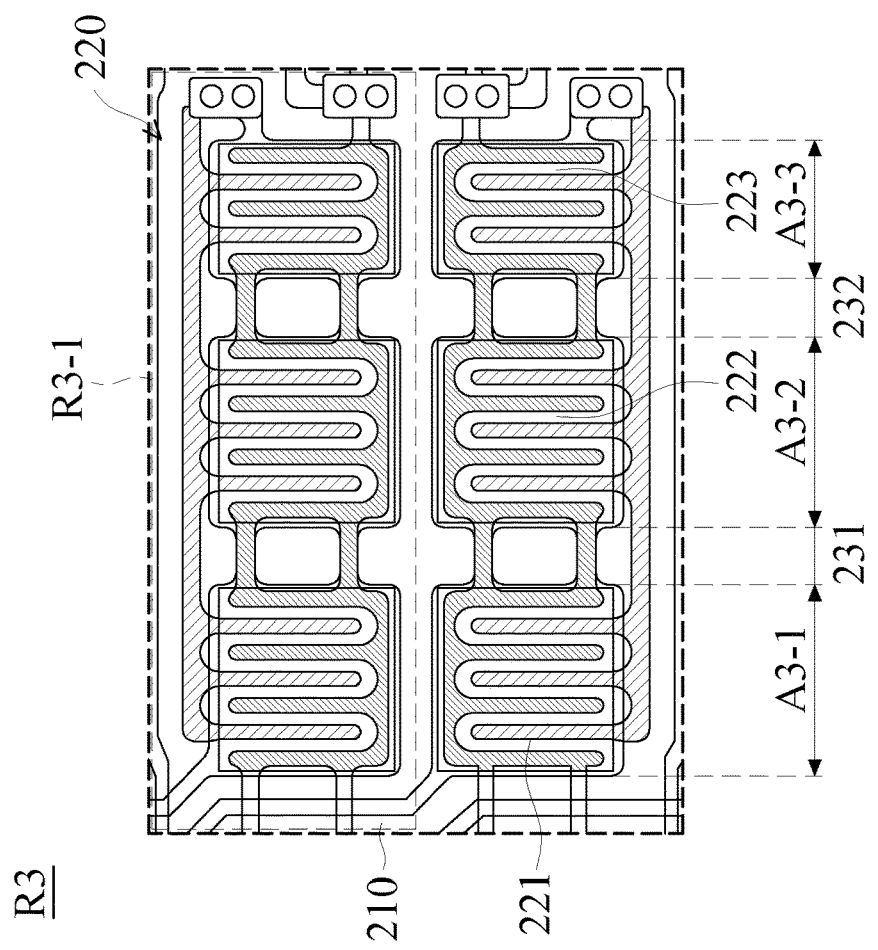
FIG. 9 is an enlarged view illustrating the driving substrate in the region R3 shown in FIG. 8 in accordance with some embodiments of the present disclosure.

FIG. 9 is an enlarged view illustrating the driving substrate 200 in the region R3 shown in FIG. 8 in accordance with some embodiments of the present disclosure. As shown in FIG. 9, the thin film transistor 220 may be divided into multiple active blocks, for example, the active block 221, the active block 222, and the active block 223. It is noted that and the number of the active blocks is not limited thereto. In the present embodiment, a gap 231 is formed between two adjacent active blocks 221 and 222, that is, the active blocks 221 and 222 are separated from each other by the gap 231. Similarly, a gap 232 may be form between the active blocks 222 and 223. In some embodiments, a ratio of the gap 231 to an average width of the active block 221 and the active block 222 in the first direction (such as the direction X) is greater than or equal to 0.1 and less than 0.5 (0.1≤the gap 231/[(the width A3-1+the width A3-2)/2]<0.5).

In some embodiments, the width A3-1 of the active block 221 is substantially the same as the width A3-2 of the active block 222, which may be about 46.71 μm, for example. According to some embodiments, the width A3-1 and the width A3-2 may be different. The gap 231 is less than the width A3-1 of the active block 221 and/or the width A3-2 of the active block 222, and may be about 15.26 μm, for example. Accordingly, the ratio of the gap 231 to an average width of the two adjacent active blocks 221 and 222 in the first direction (i.e. the direction X) is about 0.33. According to some embodiments, the gap 231 may be less than the minimum one of the widths of the adjacent active blocks. For example, the width A3-1 may be greater than the width A3-2, and the gap 231 may be less than the width A3-2. In some embodiments, the width A3-3 of the active block 223 may be about 33.76 μm, for example. The gap 232 is less than the width A3-2 of the active block 222 and the width A3-3 of the active block 223, and may be about 15.72 μm, for example. Accordingly, the ratio of the gap 232 to an average width of the two adjacent active blocks 222 and 223 in the first direction is about 0.39. As such, the risk of short circuit between the adjacent active blocks would decrease, or the size of the overall device would be miniaturized to a suitable degree. In some embodiments, the above widths A3-1, the width A3-2, the width A3-3, the gap 231, and the gap 232 are measured in the direction X, for example.

Figure 10:
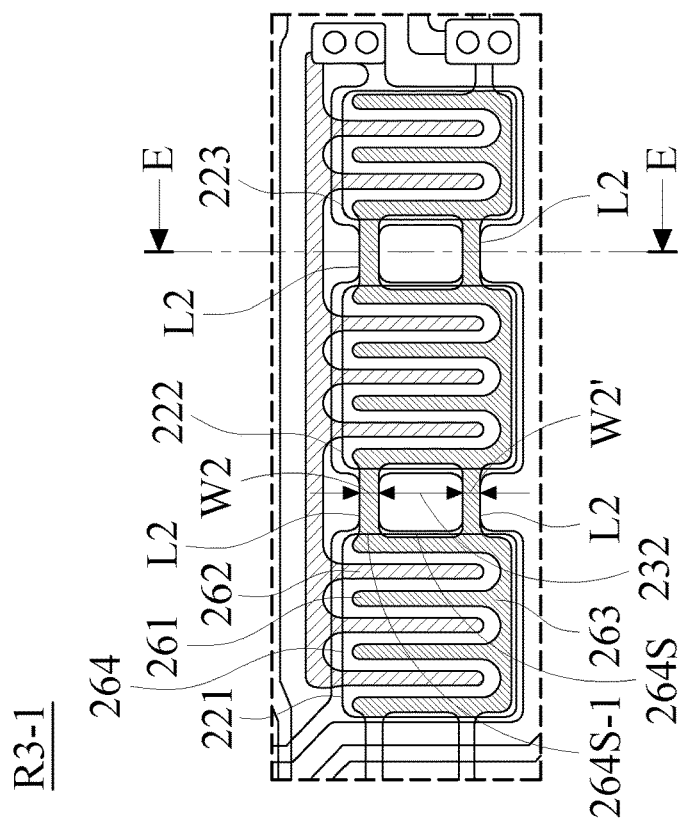
FIG. 10 is a top view illustrating the thin film transistor shown in FIG. 9.

FIG. 10 is a top view illustrating the thin film transistor 220 shown in FIG. 9. As shown in FIG. 10, the thin film transistor 220 includes a gate electrode, a semiconductor, a source electrode, and a drain electrode. Each of the active blocks 221, 222, and 223 includes a portion of the gate electrode, a portion of the semiconductor, a portion of the source electrode, and a portion of the drain electrode. The portions of the gate electrode, the portions of the source electrode or the portions of the drain electrode in different active blocks 221, 222, and 223 are electrically connected with each other.

For example, the active block 221 includes a portion of the gate electrode 261, a portion of the semiconductor, a portion of the source electrode 262, and a portion of the drain electrode 263. In some embodiment, in the top view (such as FIG. 10), the source electrode 262 or the drain electrode 263 has a curved edge. In some embodiments, the portions of the gate electrode 261 in different active blocks 221, 222, and 223 are electrically connected with each other by at least one first bridge L1 (See FIG. 11). In some embodiments, a number of the first bridges L1 is greater than or equal to two. In some embodiments, the portions of the source electrode 262 or the portions of the drain electrode 263 in different active blocks 221, 222, and 223 are electrically connected with each other by at least one second bridge L2. In some embodiments, a number of the second bridges L2 is greater than or equal to two. In the present embodiment, in the top view, the portion 264 of the semiconductor having a side 264S, a portion 264S-1 of the side 264S may overlap with the portion 263 of the source electrode in the top view. According to some embodiments, a length of the portion 264S-1 may be greater than a width W2 of the second bridge L2 in the second direction. As such, the risk or probability that the source electrode 262 or the drain electrode 263 breaks or fail would be reduced, enhancing the reliability of the electronic device.

In the present embodiment, in the second direction (such as the direction Y), the first bridges L1 and the second bridge L2 are separated by the gap 232. One of the second bridges L2 has a second width W2, and another one of the second bridges L2 has an another second width W2', and a ratio of the gap 232 to a sum of the gap 232 and an average of the second width W2 and the another second width W2' is greater than or equal to 70% and less than or equal to 90% (70%≤the gap 232/[the gap 232+(the second width W2+the another second width W2')/2]≤90%). In the present embodiment, the first bridge L1 and the second bridge L2 may overlap in the top view, and the width W1 of the first bridge L1 may be substantially the same as the second width W2 (or the second width W2') of the second bridge L2. In some embodiments, the second width W2 is in a range about 1 µm to 5 µm, e.g. about 3.89 µm. The another second width W2' is in a range 1 µm to 5 µm (1 µm≤W2'≤5 µm), e.g. about 3.89 µm, and the gap 232 is in a range about 10 µm to 25 µm, e.g. about 20.76 µm. Accordingly, the ratio of the gap 232 to a sum of the gap 232 and an average of the second width W2 and the another second width W2' is about 84.2%.

Figure 11:
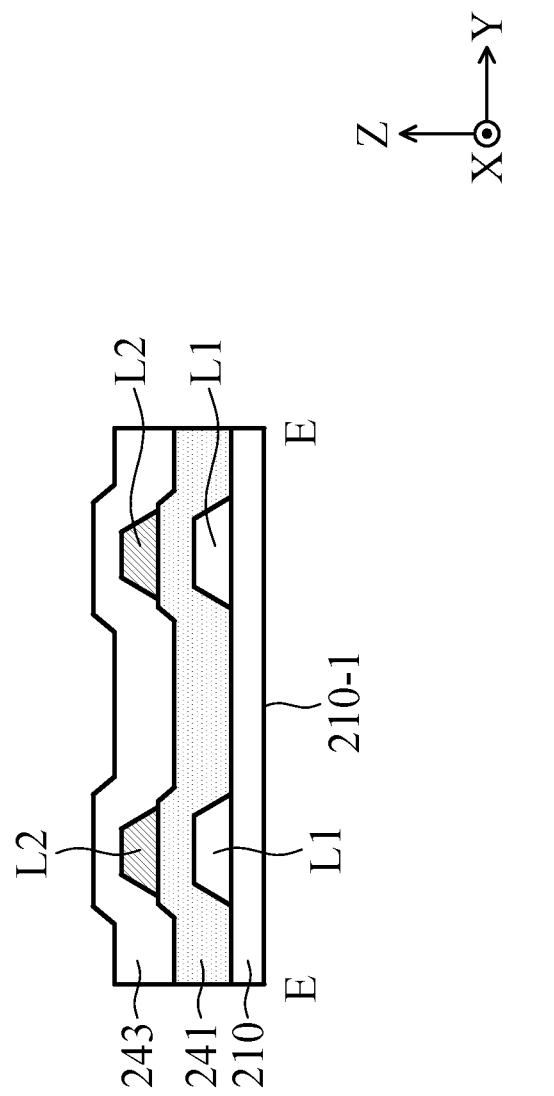
FIG. 11 is a cross-sectional view illustrating the driving substrate along line E-E shown in FIG. 10.

FIG. 11 is a cross-sectional view illustrating the driving substrate 200 along line E-E shown in FIG. 10. As shown in FIG. 11, the first bridge L1 is overlapped with the second bridge L2 in a direction (such as the direction Z) that is perpendicular to a lower surface 210-1 of the substrate 210. It should be noted that the term "overlap" discussed in the present disclosure may include embodiments in which different elements at least partially overlap, but it is not limited thereto. According to some embodiments, the term "overlap" in the present disclosure may be referred to that different elements completely overlap. So that, in the cross sectional view, the gap (such as the gap 231) between the adjacent active block may be increased, and the area of the cured adhesive material which exposed by the space having the gap may also be increased. The driving substrate and the opposite substrate may be bonded more firmly.

Figure 12:
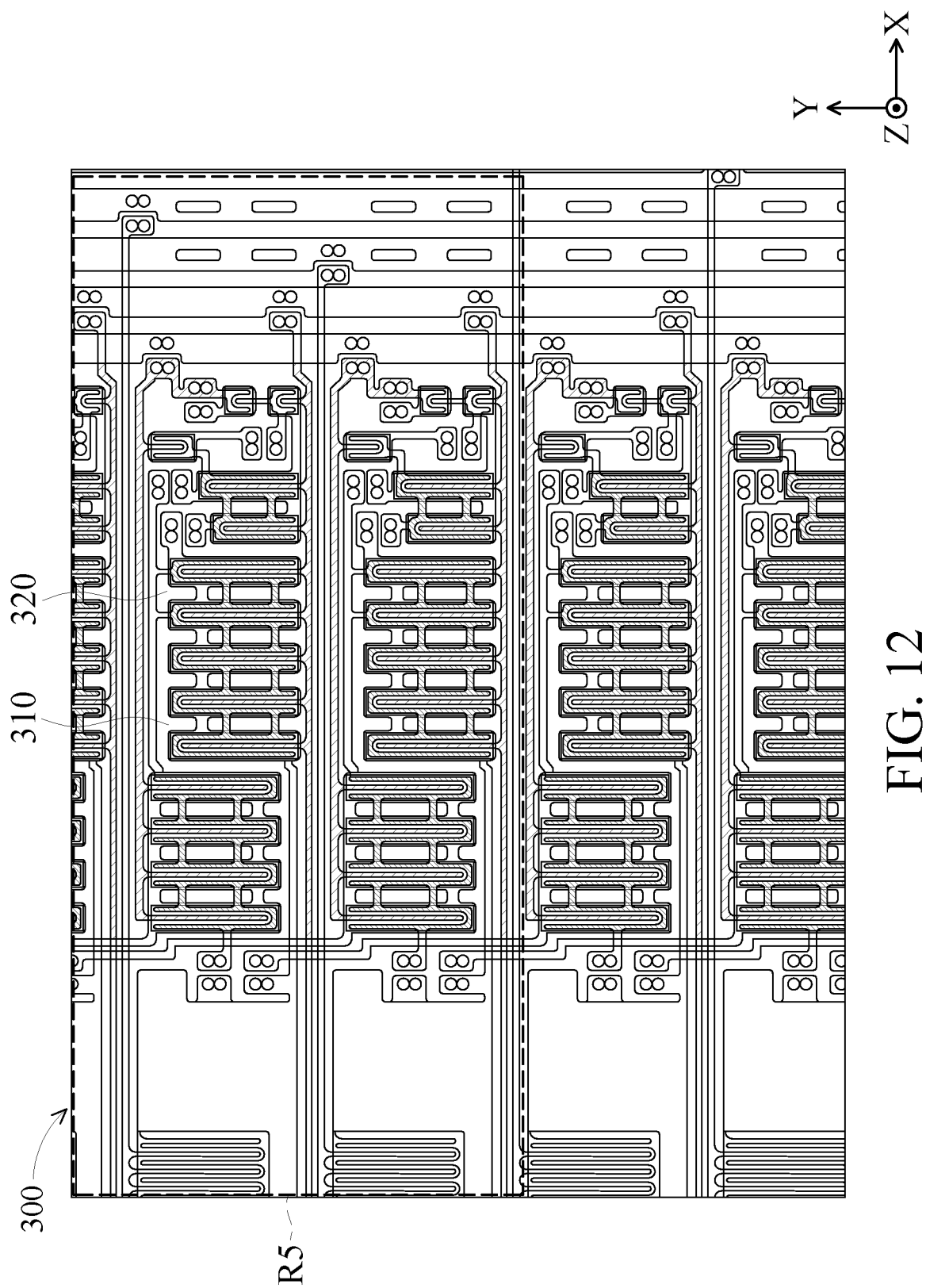
FIG. 12 is a top view illustrating the driving substrate in accordance with some embodiments of the present disclosure.

FIG. 12 is a top view illustrating the driving substrate 300 in accordance with some embodiments of the present disclosure. It should be noted that the driving substrate 300 in the present embodiment may include similar components as the driving substrate 100 shown in FIG. 2. For the sake of simplicity and clarity, these similar components will be denoted by similar numerals, and will not be discussed in detail. For example, the driving substrate 300 includes a substrate 310 and at least one thin film transistor, such as a thin film transistor 320 disposed on the substrate 310. The thin film transistor 320 is divided into at least two active blocks, and the details regarding the dimension of the active blocks and the gaps therebetween will be discussed below.

Figure 13:
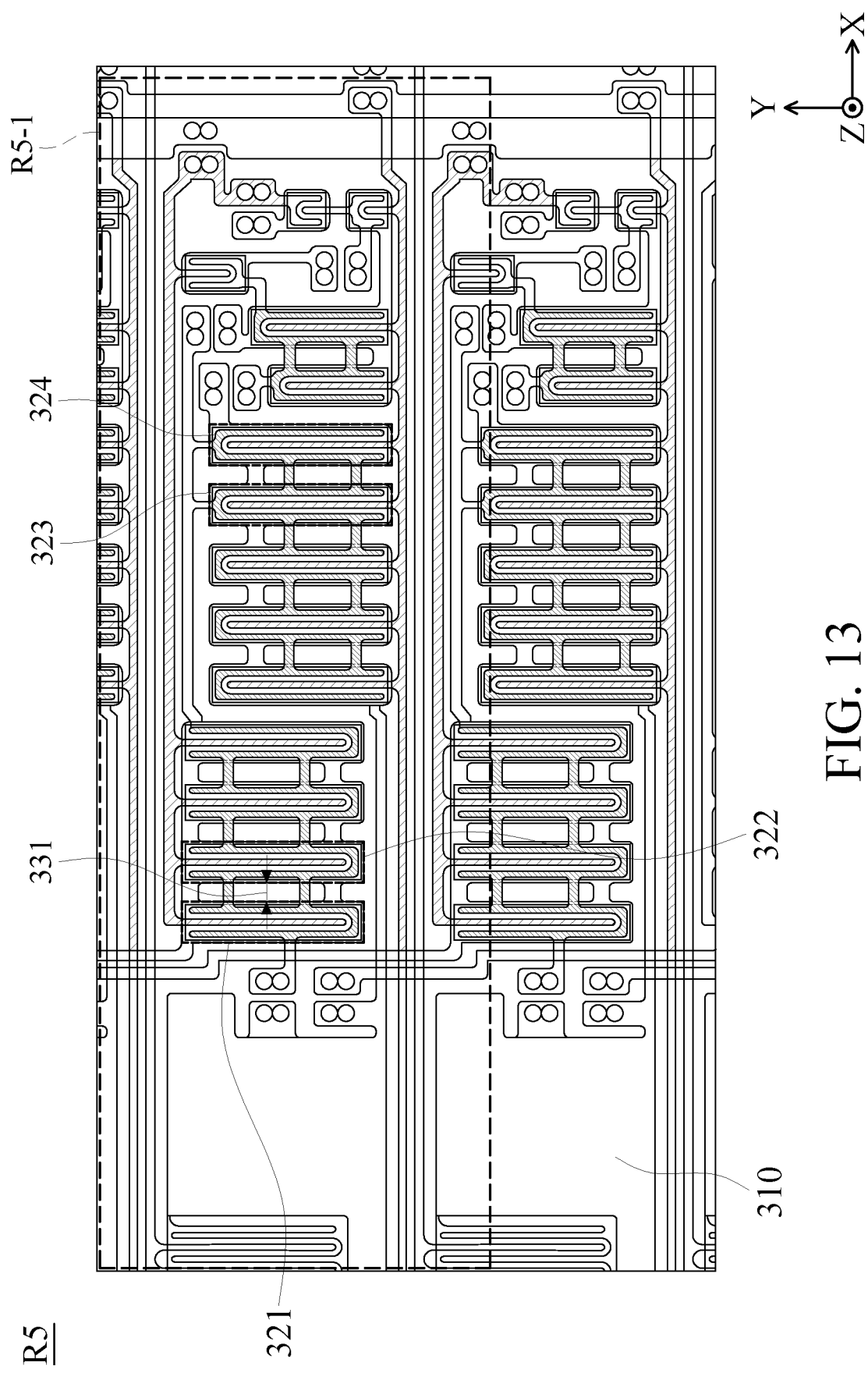
FIG. 13 is an enlarged view illustrating the driving substrate in accordance with some embodiments of the present disclosure.
Figure 14:
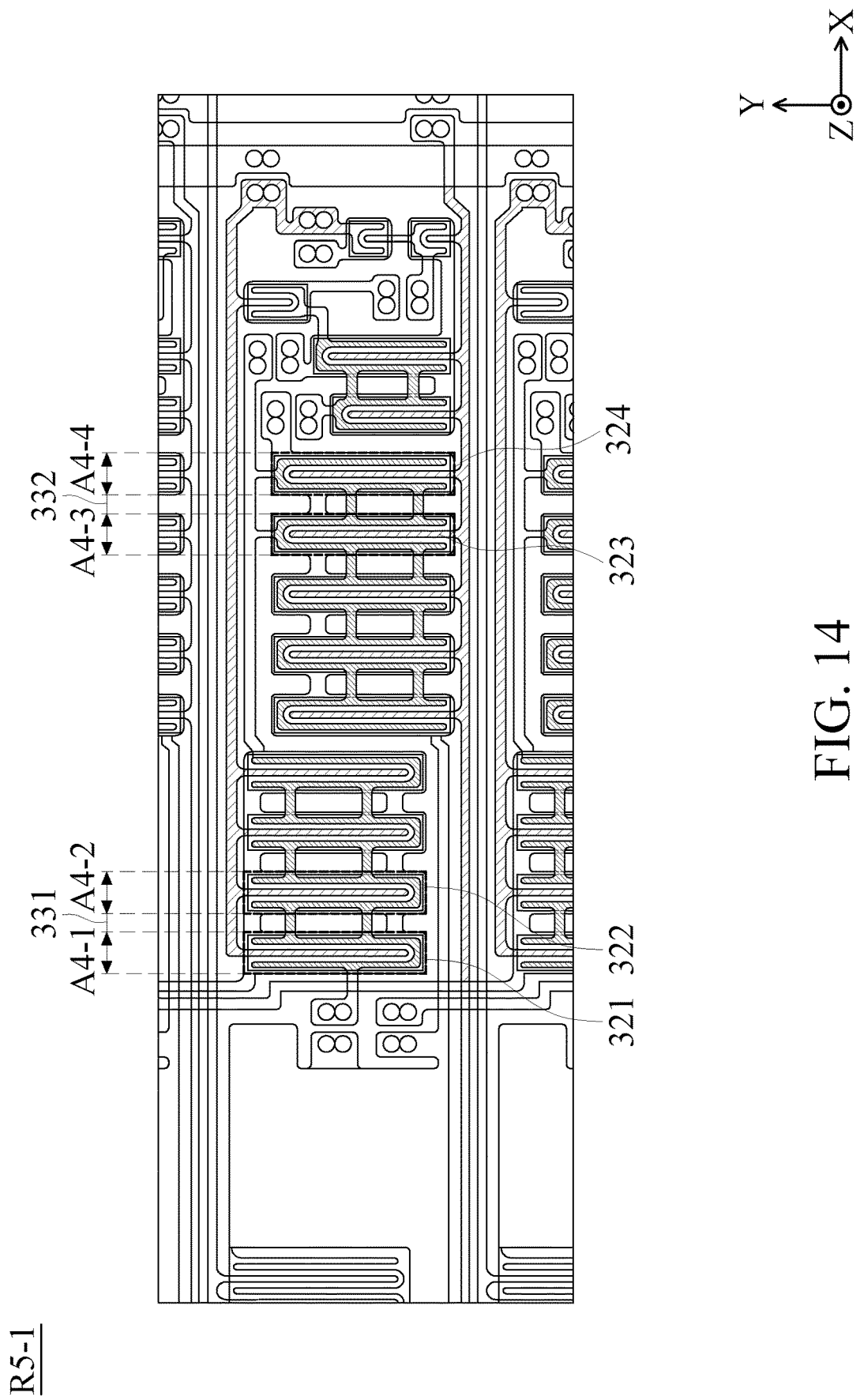
FIG. 14 is an enlarged view illustrating the driving substrate in accordance with some embodiments of the present disclosure.

FIG. 13 is an enlarged view illustrating the region R5 of the driving substrate 300 shown in FIG. 12 in accordance with some embodiments of the present disclosure. FIG. 14 is an enlarged view illustrating the region R5-1 of the driving substrate 300 shown in FIG. 13 in accordance with some embodiments of the present disclosure. As shown in FIG. 13, the thin film transistor 320 may be divided into multiple active blocks, for example, the active block 321, the active block 322, the active block 323, and the active block 324. It is noted that and the number of the active blocks is not limited thereto. In the present embodiment, a gap 331 is formed between two adjacent active blocks, such as the active block 321 and the active block 322, that is, the two adjacent active blocks, such as the active block 321 and the active block 322, are separated from each other by the gap 331 in the first direction. In some embodiments, a ratio of the gap 331 to an average width of the active block 321 and the active block 322 in the first direction (such as the direction X) is greater than or equal to 0.1 and less than 0.5 (0.1≤the gap 331/[(the width A4-1+the width A4-2)/2]<0.5). The arrangement of these active blocks and gaps is similar to the arrangement of the active block 321, the active block 322, and the gaps 331, which will not be discussed in detail below.

In some embodiments, the width A4-1 of the active block 321 may be about 27.75 µm, for example. The width A4-2 of the active block 322 may be about 27.75 µm, for example. The gap 331 is less than the width A4-1 of the active block 321 and the width A4-2 of the active block 322, and may be in a range about 5 µm to 15 µm, e.g. about 11.56 µm, for example. Accordingly, the ratio of the gap 331 to an average width of the two adjacent active blocks 321 and 322 in the first direction is about 0.42. In some embodiments, the width A4-3 of the active block 333 and the width A4-4 of the active block 334 are about 26.82 µm, the gap 332 is about 11.56 µm. Accordingly, the ratio of the gap 332 to an average width of the two adjacent active blocks 333 and 334 in the first direction is about 0.43.

Figure 15:
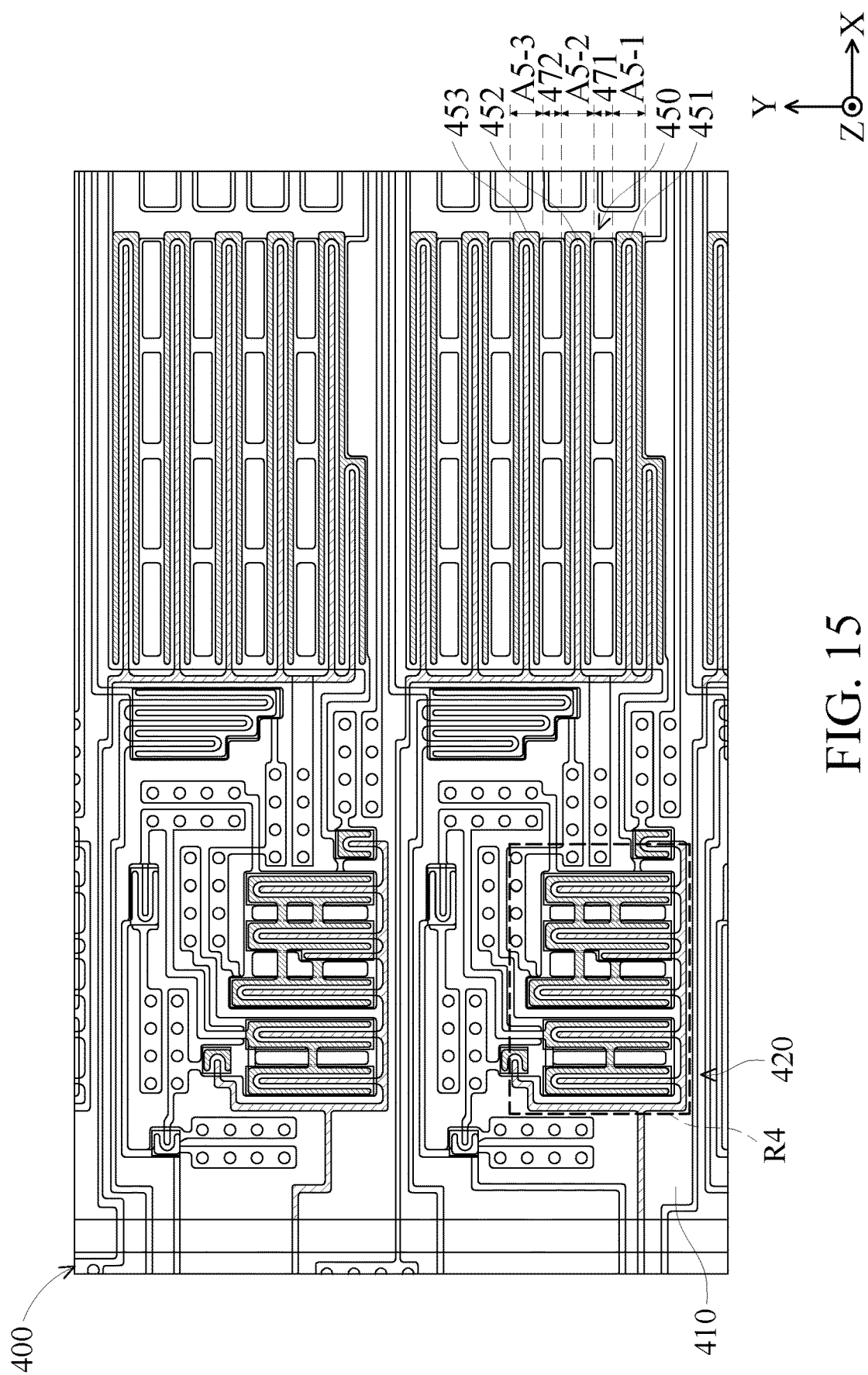
FIG. 15 is a top view illustrating the driving substrate in accordance with some embodiments of the present disclosure.

FIG. 15 is a top view illustrating the driving substrate 400 in accordance with some embodiments of the present disclosure. It should be noted that the driving substrate 400 in the present embodiment may include similar components as the driving substrate 100 shown in FIG. 2. For the sake of simplicity and clarity, these similar components will be denoted by similar numerals, and will not be discussed in detail. For example, the driving substrate 400 includes a substrate 410 and at least one thin film transistor, such as a thin film transistor 420 and a thin film transistor 450, disposed on the substrate 410. The thin film transistor 420 is divided into at least two active blocks, and the details regarding the dimension of the active blocks and the gaps therebetween will be discussed below.

As shown in FIG. 15, the thin film transistor 450 may be divided into multiple active blocks, for example, the active block 451, the active block 452, and the active block 453. It is noted that and the number of the active blocks is not limited thereto. In the present embodiment, a gap 471 is formed between two adjacent active blocks 451 and 452, that is, the active blocks 451 and 452 are separated from each other by the gap 471 in the first direction. Similarly, a gap 472 may be form between the active block 452 and 453. In some embodiments, a ratio of the gap 471 to an average width of the active block 451 and the active block 452 in the first direction (such as the direction X) is greater than or equal to 0.1 and less than 0.5 (0.1≤the gap 471/[(the width A5-1+the width A5-2)/2]<0.5).

In some embodiments, the width A5-1 of the active block 451 may be about 39.29 µm, and the width A5-2 of the active block 452 may be about 25.42 µm, for example. The gap 471 is less than an average of the width A5-1 and the width A5-2, and may be about 11.55 µm, for example. Accordingly, the ratio of the gap 471 to an average of the width A5-1 and the width A5-2 in the direction Y is about 0.36. In some embodiments, the width A5-3 of the active block 453 may be about 25.42 µm, for example. The gap 472 is less than an average of the width A5-2 and the width A5-3, and may be about 11.55 µm, for example. Accordingly, the ratio of the gap 472 to an average of the width A5-2 and the width A5-3 in the direction Y is about 0.45.

Figure 16:
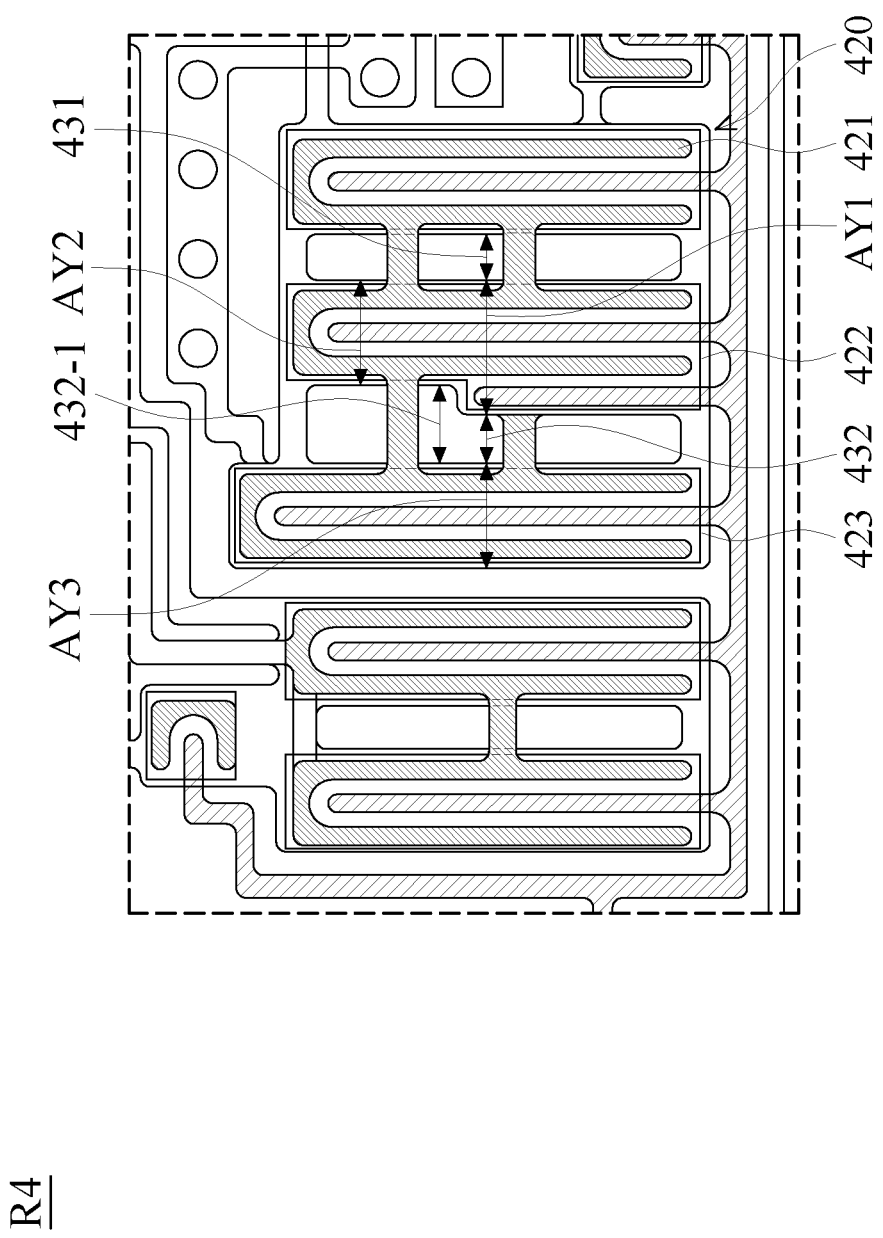
FIG. 16 is an enlarged view illustrating the driving substrate in the region R4 shown in FIG. 15 in accordance with some embodiments of the present disclosure.

FIG. 16 is an enlarged view illustrating the driving substrate 400 in the region R4 shown in FIG. 15 in accordance with some embodiments of the present disclosure. As shown in FIG. 16, the thin film transistor 420 may be divided into multiple active blocks, for example, the active block 421, the active block 422, and the active block 423. It is noted that and the number of the active blocks is not limited thereto. In the present embodiment, a gap 431 is formed between two adjacent active blocks 421 and 422, that is, the active blocks 421 and 422 are separated from each other by the gap 431 in the first direction. Similarly, a gap 432 and a gap 432-1 may be form between the active blocks 422 and 423. In the present embodiment, the active blocks 422 and 423 are separated from each other by the gap 432 and the gap 432-1, wherein the gap 432 is less than the gap 432-1. Correspondingly, the active block 422 has two different widths AY1 and AY2, wherein the width AY1 is greater than the width AY2. In some embodiments, a ratio of the gap 432 to an average width of the active block 452 (such as the width AY1) and the active block 423 (such as the width AY3) in the first direction (such as the direction X) is greater than or equal to 0.1 and less than 0.5 (0.1≤the gap 432/[(the width AY1+the width AY3)/2]<0.5). That is, if multiple gaps exist between two adjacent active blocks, choose the minimum one to calculate the ratio as mentioned above. According to some embodiments, a minimum gap between the active block 423 and the active block 422 may be determined in the first direction, and then the width of the active block 423 and the width of the active block 422 may be determined from the opposite sides of the gap in the first direction. It should be noted that all the above values (such as the gaps, the widths, and the distances) or the ratios may be the calculated and determined using their own minimum value. However, the present disclosure is not limited thereto.

As set forth above, the embodiments of the present disclosure provide a driving substrate and an electronic device including a thin film transistor that is divided into multiple active blocks. As such, the light would pass through the spaces having the gaps between the active blocks, and the area of the cured adhesive material may increase, enhancing the adhesion of the adhesive material. Therefore, the peeling possibility of the driving substrate may be reduced. In addition, if the ratio of the gap to an average width of the two adjacent active blocks is too small, the risk of short circuit between the adjacent active blocks may increase. Otherwise, if the ratio of the gap to an average width of the two adjacent active blocks is too high, the size of the peripheral region PA of the electronic device may increase to an unacceptable degree. In some embodiments, the size of the peripheral region PA may be a width in the direction X or an area of the peripheral region PA.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A driving substrate, comprising:
a substrate; and
a thin film transistor disposed on the substrate and comprising:
a first metal layer having a first island shape portion, a second island shape portion, and a first bridge extending along a first direction, wherein in a second direction perpendicular to the first direction, a width of the first bridge is less than both a width of the first island shape portion and a width of the second island shape portion;
a second metal layer having a third portion, a fourth portion, and a second bridge; and
a semiconductor, wherein the first metal layer, the second metal layer, and the semiconductor are overlapped with each other;
wherein in a top view, the first island shape portion and the second island shape portion are separated by a first gap and are connected by the first bridge, the third portion and the fourth portion are separated by the first gap and are connected by the second bridge.

2. The driving substrate according to claim 1, wherein a portion of the first bridge is parallel to a portion of the second bridge.

3. The driving substrate according to claim 1, wherein a portion of the first bridge is overlapped with a portion of the second bridge.

4. The driving substrate according to claim 1, wherein an area of the first island shape portion is different from an area of the second island shape portion.

5. The driving substrate according to claim 1, wherein an extending direction of the first bridge is perpendicular to an extending direction of the third portion and the fourth portion of the second metal layer.

6. The driving substrate according to claim 1, further comprising a first insulating layer disposed on the substrate and located between the first metal layer and the second metal layer.

7. The driving substrate according to claim 6, further comprising a second insulating layer disposed on the second metal layer and the first insulating layer.

8. The driving substrate according to claim 1, wherein in the top view, a portion of the first bridge is spaced apart from a portion of the second bridge.

9. The driving substrate according to claim 1, wherein the semiconductor comprises a first part and a second part, the first island shape portion of the first metal layer has a first projection area on the substrate, and the second island shape portion of the first metal layer has a second projection area on the substrate, wherein both of the first part of the semiconductor and the third portion of the second metal layer overlap with the first projection area, and both of the second part of the semiconductor and the fourth portion of the second metal layer overlap with the second projection area.

* * * * *